Figure 3A:
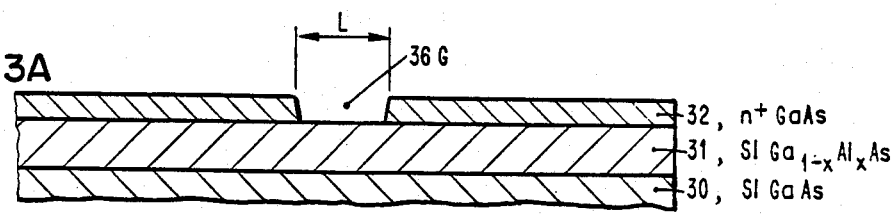
Figure 3B:
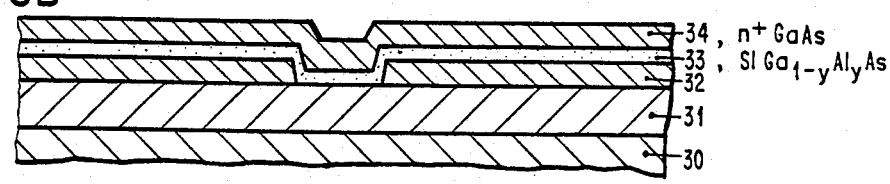
Figure 3C:
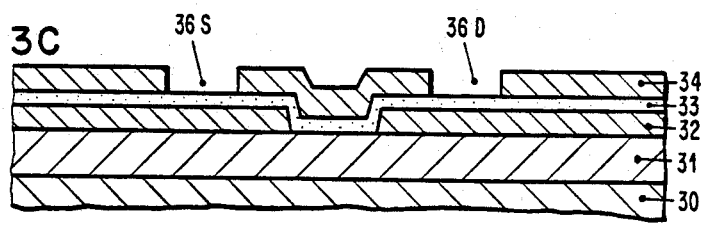

United States Patent [19]

Harder et al.

[11] Patent Number: 4,675,711

[45] Date of Patent: Jun. 23, 1987

[54] LOW TEMPERATURE TUNNELING TRANSISTOR

[75] Inventors: Christoph S. Harder; Hans P. Wolf, both of Zurich; Werner Baechtold, Langnau; Pierre L. Gueret, Richterswil; Alexis Baratoff, Schönenberg, all of Switzerland

[73] Assignee: International Business Machines Corporation, Armonk, N.Y.

[21] Appl. No.: 798,653

[22] Filed: Nov. 15, 1985

[30] Foreign Application Priority Data

Dec. 18, 1984 [EP] European Pat. Off. ........ 0841154289

[51] Int. Cl.⁴ .................... H01L 29/12; H01L 29/80; H01L 29/66
[52] U.S. Cl. .......................... 357/22; 357/5; 357/6; 357/23.1; 357/23.15; 357/16; 357/83
[58] Field of Search ................ 357/22 A, 22 MD, 6, 357/23.1, 23.15, 5, 83, 16

[56] References Cited

U.S. PATENT DOCUMENTS 4,583,105  4/1986  Rosenberg ...................... 357/22 A

FOREIGN PATENT DOCUMENTS 2607940   9/1977  Fed. Rep. of Germany ......... 357/6
57-164573 10/1982  Japan ........................... 357/22 MD Primary Examiner—Andrew J. James
Assistant Examiner—Jerome Jackson
Attorney, Agent, or Firm—Jeffrey S. LaBaw; T. J. Kilgannon; M. H. Klitzman

[57] ABSTRACT

The transistor comprises two electrodes, (source (22) and drain (23), with a semiconductor tunnel channel (21A, 21B) arranged therebetween. A gate (24) for applying control signals is coupled to the channel. The semiconductor channel consists of a plurality of regions differing in their current transfer characteristics: contact regions (21c), connected to the source and drain electrodes, and a tunneling region (21t) arranged between the contact regions. The energy of free carriers in the contact regions differs from the energy of the conduction band or the valence band of the tunneling region which forms a low energy tunnel barrier the height ($\Delta E$) of which can be modified by control signals applied to the gate. The operating temperature of the device is kept sufficiently low to have the tunnel current through the barrier outweigh currents of thermionically excited carriers.

12 Claims, 12 Drawing Figures

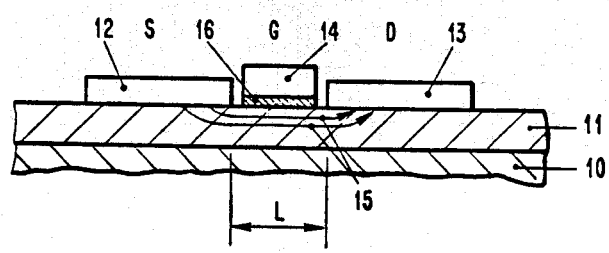
FIG. 1
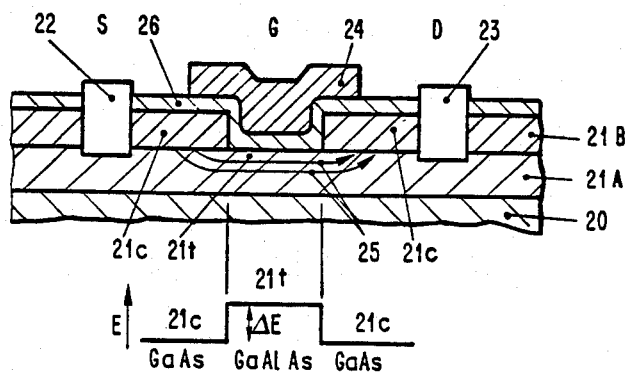
FIG. 2A
FIG. 2B
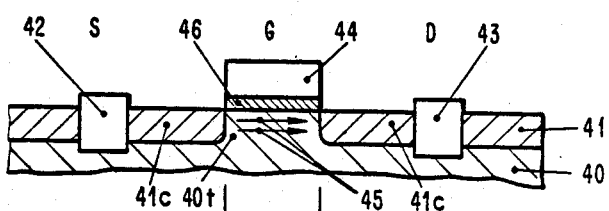
FIG. 4A
FIG. 4B
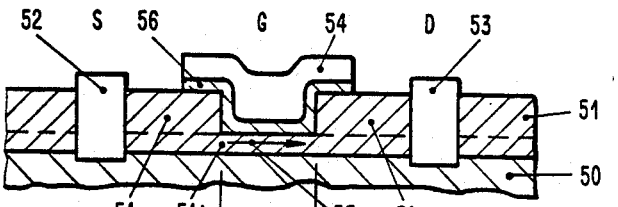
FIG. 5A
FIG. 5B

LOW TEMPERATURE TUNNELING TRANSISTOR

The invention relates to a low temperature tunneling transistor and particularly to a device comprising two electrodes with a semiconductor channel arranged therebetween that provides a low energy barrier and through which tunneling currents may flow. A gate terminal connected to the semiconductor is provided for applying control signals. The device may be utilized, for example, as a switching device in memory or logic circuitry as well as having applications as an analog signal amplifier.

Various transistors for low temperature operations have been proposed which offer, particularly if superconducting materials are used, substantial advantages such as low power dissipation, high package density and high speed both at the device and system level. Some of the more promising structures are discussed below.

U.S. Pat. No. 4,220,959 discloses a Josephson tunnel junction device having a polycrystalline semiconductor tunneling barrier comprised of silicon, germanium or an alloy thereof. The barrier height is, during fabrication, controlled by appropriate doping of the semiconductor material. In operation, the device is controlled by applying magnetic fields by means of a control line adjacent to and electrically insulated from the superconducting electrodes.

U.S. Pat. No. 3,500,137 discloses a cryogenic electronic device comprising a semiconductor channel permitting superconducting carrier transport and operated analogously to field effect transistors. Both depletion mode and enhancement mode operations are described. A first gate is provided to apply an electric field to the channel to either deplete or enhance the conducting region. A second gate can be used to apply a magnetic field to the channel in order to switch the superconducting region to the normal resistive state.

The so-called Gray-Transistor is described in U.S. Pat. No. 4,157,555. The device consists of two tunnel junctions, injector and collector, that are formed in a sandwich structure of superconductor (S) and isolating (I) layers. In operation, quasi-particles are injected into the center superconductor whereby the tunneling current into the collector is increased. Current gain depends on a collector multiplication effect—introduced quasi-particles may undergo energy changes and cross the barrier more than once—tied to long recombination times.

U.S. Pat. No. 4,334,158 discloses another superconducting tunnel junction transistor which became known as the quiteron. The disclosed device structure is similar to that of the Gray-transistor in that it comprises an injector junction and an acceptor junction formed by three superconducting electrodes with tunnel barriers located therebetween. In operation, heavy quasi-particle injection into the center electrode changes the superconducting gap of that electrode drastically.

This, in turn, affects the current in the acceptor junction providing current gain.

For transistors operating at low temperatures there are several desired device properties which include voltage/current gain, high speed, high package density potential, good isolation properties, and low power consumption. In addition, simple structures adequate for large scale integration techniques are needed. None of the devices discussed above appears to simultaneously meet all of these requirements in a satisfactory manner, each having its strengths and weaknesses.

More recently, a new concept was proposed in European patent application No. 83.113163.6 describing a low temperature tunneling transistor in which the low energy barrier (meV) provided by a thin semiconductor barrier layer can be controlled by voltages in the mV range applied to the barrier. At low temperatures the tunnel current through the barrier outweighs the current of thermionically excited carriers. The control voltages modify the barrier height thereby changing the tunnel probability. In practice, the interfaces between the electrodes and the thin semiconductor barrier (thickness of about 100 nm) are not well defined. Also, the fabrication of an adequate barrier is not a simple task in the various proposals made, i.e., use of a properly doped semiconductor, a small band-gap material or an nipi-superlatice structure, since, as of today, the knowledge and experience in the respective technologies is rather limited.

It is thus a main object of the present invention to provide a high speed transistor employing a low energy tunnel barrier operating with control signals in the mV range in which interface problems are avoided. Another object is to provide a transistor with a semiconductor tunnel barrier that can be fabricated employing materials and processes that are well understood and easy to control and that can be calculated and precisely adjusted.

The invention as claimed is intended to meet the above objectives and remedy the drawbacks of hitherto known devices.

The main advantages offered by the invention are seen in that interface problems, leading to the formation of unpredictably distorted barriers, are avoided in that the energy barrier is formed within the semiconductor material, i.e., not in the immediate interface region, barrier heights and shapes can be calculated and precisely adjusted, well characterized, undoped semiconductors can be employed to form the barrier; examples are Si, GaAs as well as GaAlAs with which established fabrication methods can be used, and in that undesirable hopping conduction via dopants or defects in the barrier, which are present in some embodiments of patent application No. 83.113163.6, can be suppressed.

Several ways of carrying out the invention are described in detail below with reference to drawings which illustrate specific embodiments of the invention and in which FIG. 1 shows a schematic cross section of a basic FET to which the present invention relates, FIGS. 2A,B show a schematic cross section of a first embodiment of the invention and the resulting energy diagram illustrating the achieved energy barrier, FIGS. 3A-E illustrate the process of fabricating the FET structure shown in FIG. 2A, FIGS. 4A,B show a schematic cross section of a second embodiment of the invention and the resulting energy diagram illustrating the achieved energy barrier, and FIGS. 5A,B show a schematic cross section of a further embodiment of the invention and the resulting energy diagram illustrating the achieved energy barrier.

The basic structure of the proposed tunneling transistor corresponds to that of the transistor described in the earlier European patent application No. 83.113163.6 which is sketched in FIG. 1. On an insulating or semi-insulating substrate 10, a semiconductor channel 11 is arranged with source 12, drain 13 and gate 14 electrodes attached thereto. The paths of the current flowing between source and drain are indicated and designated 15. In the device disclosed in the earlier European patent application, the channel, forming an energy barrier, is short enough so as to allow significant tunneling of charge carriers (quasi-particles, electrons or holes) through it under the influence of an applied drain voltage. Due to the low barrier height it can, on the other hand, be made physically long enough to be realized with today's technological capabilities. Conditions are chosen such that tunnel currents outweigh currents of thermionically excited carriers. The tunnel current can be controlled by applying a voltage to the gate electrode 14 which lowers or increases the height of the tunnel barrier between source and drain thereby affecting the tunnel probability. The gate is preferably insulated from the semiconductor channel by an insulator 16.

In the novel transistor structure in accordance with the invention described hereinbelow, the semiconductor channel consists of a plurality of regions differing in their current transfer characteristics. Contact regions, so doped as to remain conducting at the operating temperature, are connected via ohmic contacts to the source and drain electrodes, respectively, and at least one tunneling region, forming the energy barrier, is arranged between these contact regions. The required step in energy level, i.e., the energy barrier, is thus formed within the semiconductor channel rather than at the electrode-semiconductor interfaces. With such a structure the hitherto encountered interface problems, caused e.g., by the formation of non-linear barriers or of space charges that may be detrimental to the operation of the transistor, are avoided. In addition, the energy barrier can be defined more accurately in that it can be achieved by using substantially less critical and better known materials and processes.

As with the transistor described in the European patent application referred to above, the term, "low temperature transistor" is an expression of the requirement that the operating temperature of the device has to be kept sufficiently low in order to guarantee that tunnel currents through the energy barrier outweigh currents of thermionically excited carriers.

In a first preferred embodiment of a transistor in accordance with the present invention the energy barrier is obtained by increasing the conduction band energy in the tunneling region through the addition of suitable material. The structure is schematically shown in FIG. 2A. A tunneling layer 21A of semi-insulating GaAlAs with a small Al content is deposited on a substrate 20. It provides the tunneling region in the semiconductor which is designated 21t. Another semiconductor layer 21B consists of n+GaAs and patterned as shown to provide for the gate contact of width L (approx. 100 nm) is arranged on top of layer 21A. Sections 21c of this layer form the contact regions. Layer 26 of GaAlAs with a high Al content serves as gate insulator. The gate contact area 24 consists of the same material as that of layer 21B, i.e., n+GaAs Source and drain electrodes 22 and 23, respectively, are formed by an ion implantation process with subsequent metal level deposition. The tunnel current paths through the tunnel region 21t of layer 21A are designated 25.

In this embodiment the conduction band energy in the tunneling region 21t is higher than in the contact regions 21c due to the addition of suitable material to the semiconductor, in the described structure by the addition of Al to GaAs. Well-known large-bandgap materials can be used because all that counts is the difference $\Delta E$ between the conduction band energies in the tunneling region and in the contact regions, respectively.

The example just described represents a n-TFET in which electron tunneling occurs through the tunneling region close to the conduction band. However, structures for hole tunneling in the vicinity of the valence band (p-TFET) can be designed equally well in which case the contact regions would have to be doped with an acceptor.

FIG. 2B illustrates the energy diagram of the device of FIG. 2A. By adding Al in the tunneling region 21t, the energy barrier is obtained through which tunneling occurs. A typical value for the difference $\Delta E$ between the band edges of the contact regions 21c and the tunneling region 21t, respectively, is 40 meV if the tunneling region consists of $Ga_{1-x}Al_xAs$ with x in the order of 0.06.

The process of fabricating a transistor structure according to the schematic of FIG. 2A will now be described with the aid of FIG. 3A through 3E.

Figure 3D:
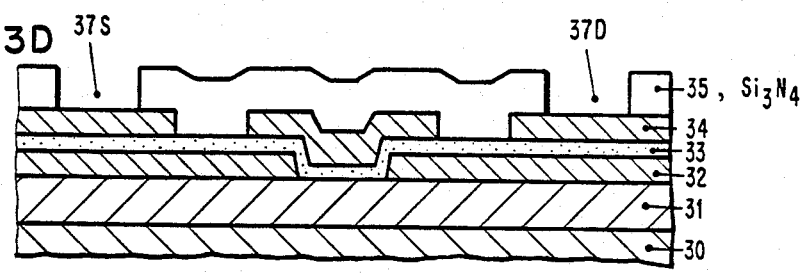
Figure 3E:
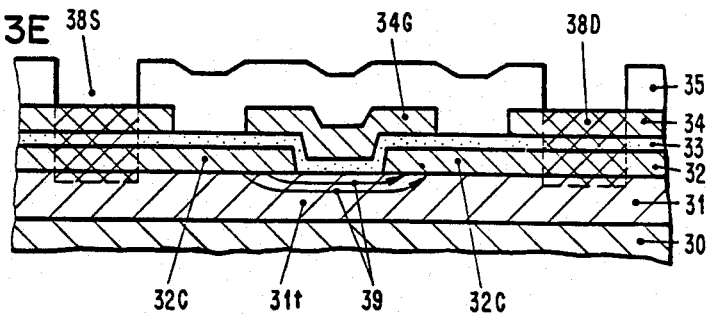

FIG. 3A shows a substrate 30 of semi-insulating GaAs upon which layers 31 and 32 are epitaxially grown, e.g., in an MBE process. Tunneling layer 31 consists of semi-insulating $Ga_{1-x}Al_xAs$ (with x=0.06 and a thickness of about 1000 nm). Contact layer 32 is an n+GaAs layer (doped approx. $10^{18}$ cm$^{-3}$ and about 25 nm thick) into which an opening 36G of a width of 100 nm for gate area definition is etched using photolithographic patterning. Subsequently, further layers 33 and 34 are grown (FIG. 3B), again using standard technologies such as MBE or MOCVD: gate insulation layer 33 consisting of $Ga_{1-y}Al_yAs$ (with y=0.3 to 0.4 and a thickness of 15 nm), and contact layer 34 of n+-doped GaAs ($2\times10^{18}$ cm$^{-2}$, 60 to 100 nm thick). In a next step (FIG. 3C), holes 36S and 36D are etched through the contact layer 34 down to the insulation layer 33 to define the electrode contact areas. Then, passivation layer 35 of $Si_3N_4$ (60 to 100 nm thick) is deposited and, after photolithographic patterning, holes 37S and 37D are etched (FIG. 3D). In a next step, source and drain areas 38S and 38D, to which ohmic metallic contacts are made later on, are obtained in an ion implantation process (FIG. 3E). Not shown in the drawing is the implanted gate area connected to the gate section 34G of contact layer 34 since it extends in a direction vertical to the plane of the drawing. The gate area is obtained simultaneously with areas 38S and 38D.

The transistor structure illustrated in FIG. 3E essentially corresponds to that of FIG. 2A. Source and drain contacts are made to areas 38S and 38D, respectively, the gate contact (not shown) connects to gate section 34G of contact layer 34. Regions 32c of contact layer 32 (n+GaAs) correspond to contact regions 21c in FIG. 2A whereas region 31t of tunneling layer 31 ($Ga_{1-x}Al_xAs$) corresponds to the tunneling region 21t in FIG. 2A. Tunnel current 39 flows through tunnel region 31t.

In the structure hereinabove described with the aid of FIG. 2A, the barrier height has been determined by adding a suitable material (such as Al) to the semiconductor (GaAs) in the tunneling region 21t thereby increasing the conduction band energy. Alternatively, the required difference of the conduction band edges in the tunneling and contact regions, respectively, can be obtained by lowering the energy of the conduction band edge in the contact regions 21c by adding a suitable material, for instance Ge to Si or In to GaAs.

Another way of forming the energy barrier within the semiconductor is to highly dope the contact regions of the semiconductor channel thereby forming impurity bands (or degenerate regions with sufficiently low resistance) in which current transport takes place. In general, the center of the impurity band in a highly doped semiconductor is some 10 meV below the band edge of the undoped material. Electrons which tunnel in the undoped tunnel region of the semiconductor "see" this energy difference as the barrier height. As an example, in silicon appropriate doping with As or P results in an impurity band that is in the order of 10 meV or more below the conduction band edge of the undoped tunnel region.

An embodiment of the invention employing the latter concept is schematically shown in FIG. 4A. Undoped Si serves as substrate 40 and is also used for the tunnel region 40t. The contact regions 41c consist of Si heavily doped with As or P. Source 42 and drain 43 electrodes form ohmic contacts with the semiconductor. Gate electrode 44 is separated from the tunnel region 40t by insulator layer 46. The tunnel current paths are designated 45.

FIG. 4B illustrates the energy diagram of the device of 4A.

The structure shown in FIG. 4A can be fabricated as follows: on an undoped Si substrate 40 which also forms the tunneling region 40t of the device, a thin oxide 46 of about 5 nm thickness is grown for the gate insulation. Then n-doped polycrystalline Si 44 is deposited as the gate material. In a next step, the gate is patterned by lithography and etching. Subsequently, a suitable dose of P or As is implanted using the gate and the resist on top of it as an implant mask. In the doped regions, particularly the contact regions 41c, impurity bands are formed whereas the tunnel region below the gate remains undoped. After an annealing step, ohmic contacts 42, 43 to the doped contact regions are made employing conventional methods.

Still a further embodiment of the invention is shown in FIG. 5A. Here, tunneling and contact regions of the semiconductor channel consist of the same material. The tunnel barrier height is defined by the thickness of the tunnel channel in the tunneling region and can be varied in a relatively large range. Use is made of the fact that in thin channels, the edge of the conduction band is increased above the bulk conduction band minimum.

In FIG. 5A the substrate is designated 50, the semiconductor contact and tunneling regions 51c and 51t, respectively, the source, drain and gate electrodes 52, 53 and 54, respectively. Arrow 55 indicates the tunnel current path. The gate isolation is designated 56.

More specifically, an undoped intrinsic GaAs channel, forming tunneling region 51t, with a thickness of 20 nm is grown onto an intrinsic GaAlAs substrate 50. By selective epitaxy GaAs contact regions 51c of n+GaAs are grown to a thickness of 40 nm. On the tunneling channel 51t an GaAlAs insulation 56 of approx. 20 nm thickness is deposited and the gate 54, again consisting of GaAs, is formed on the latter. The length of the tunnel channel through which tunnel current 55 flows is, as in the other embodiments, in the order of 100 nm. Electrodes 52 and 53, forming ohmic contacts with the semiconductor contact regions, are provided as described above using conventional processes.

FIG. 5B illustrates the energy diagram of the device of FIG. 5A. With the tunneling transistor structure as shown in FIG. 5A and with the parameters indicated above, a tunneling barrier height in the order of 10 meV can be obtained.

The described embodiments of the invention relate to structures providing for energy barrier height control for electron tunneling through that barrier. It should, however, be understood that structures providing for the control of hole tunneling can be designed applying the principles described herein without departing from the concept of the present invention.

It is also noted that the alternative ways of obtaining the difference in energy levels in the semiconductor regions which have been described hereinabove can be used alone or in combination. Also, the inventive concept has been disclosed using planar structure embodiments as examples but the basic design principles are also applicable to devices having non-planar structures, or that may require additional layers or electrodes. Obviously, materials, dimensions and production processes other than those used in connection with the described embodiments may be utilized.

Having thus described our invention, what we claim as new and desire to serve by Letters Patent is:

1. A low temperature tunneling transistor comprising, a semiconductor tunneling element, a pair of spaced apart semiconductor contact regions contacting said tunneling element and defining a tunneling region therebetween in said tunneling element, said tunneling region having an energy barrier formed therein, said contact regions having a conduction band edge energy different from the energy of the conduction band minimum or the valence band maximum of said tunneling region, and, a gate electrode disposed over said tunneling region for applying control signals to said tunneling region wherein the tunneling current through said tunneling region travels from source to drain in a lateral direction.

2. A low temperature tunneling transistor according to claim 1 wherein said contact regions are contacted by ohmic contact electrodes.

3. A low temperature tunneling transistor according to claim 2 wherein the tunnel current through said tunneling region is greater than the current due to thermionically excited carriers.

4. A low temperature tunneling transistor according to claim 2 wherein said spaced apart contact regions are gallium arsenide and said tunneling region is gallium aluminum arsenide with a small aluminum content to raise the conduction band energy in said tunneling region.

5. A low temperature tunneling transistor according to claim 2 wherein said semiconductor tunneling element is silicon and said contact regions are silicon to which germanium is added to lower the conduction band edge in said contact regions.

6. A low temperature tunneling transistor according to claim 2 wherein said semiconductor tunneling element is gallium arsenide and said contact regions are gallium arsenide to which indium is added to lower the conduction band edge in said contact regions.

7. A low temperature tunneling transistor according to claim 2 wherein said semiconductor contact regions are heavily doped and said tunneling region is undoped forming an impurity band of lower energy for said free carriers in said contact regions than the conduction band edge of said undoped tunnel region.

8. A low temperature tunneling transistor according to claim 2 wherein said tunneling region is silicon and said contact regions are silicon heavily doped with arsenic.

9. A low temperature tunneling transistor according to claim 2 wherein said tunneling region is silicon and said contact regions are silicon heavily doped with phosphorous.

10. A low temperature tunneling transistor according to claim 2 wherein said contact regions and said tunneling region are made of the same semiconductor material said tunneling region having a thickness such that the edge of the conduction band is increased above said conduction band minimum.

11. A low temperature tunneling transistor according to claim 2 wherein said tunneling region is doped with a donor impurity.

12. A low temperature tunneling transistor according to claim 2 wherein said contact regions are doped with an acceptor impurity.

* * * * *